(12) United States Patent
Popek et al.

(10) Patent No.: US 11,394,329 B2
(45) Date of Patent: Jul. 19, 2022

(54) DAMPER FOR POWER TRAIN

(71) Applicant: Hamilton Sundstrand Corporation, Charlotte, NC (US)

(72) Inventors: Grzegorz Popek, Birmingham (GB); Ignacio Castro, Gijon (ES)

(73) Assignee: HAMILTON SUNDSTRAND CORPORATION, Charlotte, NC (US)

(*) Notice: Subject to any disclaimer, the term of this patent is extended or adjusted under 35 U.S.C. 154(b) by 75 days.

(21) Appl. No.: 16/919,568

(22) Filed: Jul. 2, 2020

(65) Prior Publication Data
US 2021/0104969 A1  Apr. 8, 2021

(30) Foreign Application Priority Data
Oct. 4, 2019 (EP) .................................. 19201530

(51) Int. Cl.
*H02P 23/04* (2006.01)
*H01L 41/107* (2006.01)

(52) U.S. Cl.
CPC ............ *H02P 23/04* (2013.01); *H01L 41/107* (2013.01)

(58) Field of Classification Search
CPC ......... H02P 23/04; H01L 41/07; H01L 41/044
See application file for complete search history.

(56) References Cited

U.S. PATENT DOCUMENTS

| 3,668,507 | A | 6/1972 | Kadomsky et al. |
| 5,783,899 | A | 7/1998 | Okazaki |
| 5,831,410 | A | 11/1998 | Skibinski |
| 5,866,969 | A | 2/1999 | Shimada et al. |
| 5,923,546 | A * | 7/1999 | Shimada ............ H02M 7/48 363/40 |
| 5,990,654 | A | 11/1999 | Skibinski et al. |
| 6,122,184 | A | 9/2000 | Enjeti et al. |
| 6,278,220 | B1 | 8/2001 | Furukoshi et al. |
| 6,304,013 | B1 | 10/2001 | Akers et al. |
| 9,099,945 | B2 | 8/2015 | Sakai et al. |
| 2006/0043920 | A1 | 3/2006 | Baker |
| 2009/0267431 | A1 | 10/2009 | Tallam et al. |

FOREIGN PATENT DOCUMENTS

| EP | 2430463 B1 | 7/2013 |
| JP | 2001298963 A | 10/2001 |
| WO | 2015180558 A1 | 12/2015 |

OTHER PUBLICATIONS

A. F. Moreira, P. M. Santos, T. A. Lipo and G. Venkataramanan, "Filter Networks for Long Cable Drives and Their Influence on Motor Voltage Distribution and Common-Mode Currents," in IEEE Transactions on Industrial Electronics, vol. 52, No. 2, pp. 515-522, Apr. 2005.

A. von Jouanne et al., "Design Considerations for an Inverter Output Filter to Mitigate the Effects of Long Motor Leads in ASD Applications," in IEEE Transactions on Industry Applications, vol. 33, No. 5, pp. 1138-1145, Sep./Oct. 1997.

(Continued)

*Primary Examiner* — Karen Masih
(74) *Attorney, Agent, or Firm* — Cantor Colburn LLP

(57) ABSTRACT

A damper for a power train, comprising a piezoelectric transformer and a load element connected across the output of the piezoelectric transformer.

11 Claims, 10 Drawing Sheets

(56) References Cited

OTHER PUBLICATIONS

D. A. Rendusara and P. N. Enjeti, "An Improved Inverter Output Filter Configuration Reduces Common and Differential Modes dv/dt at the Motor Terminals in PWM Drive Systems," in IEEE Transactions on Power Electronics, vol. 13, No. 6, pp. 1135-1143, Nov. 1998.

E. Persson, "Transient Effects in Application of PWM Inverters to Induction Motors," in IEEE Transactions on Industry Applications, vol. 28, No. 5, pp. 1095-1101, Sep.-Oct. 1992.

European Search Report for Application No. 19201530.3, dated Apr. 17, 2020, 29 pages.

J. C. G. Wheeler, "Effects of Converter Pulses on the Electrical Insulation in Low and Medium Voltage Motors," in IEEE Electrical Insulation Magazine, vol. 21, No. 2, pp. 22-29, Mar./Apr. 2005.

J. He, G. Y. Sizov, P. Zhang and N. A. O. Demerdash, "A Review of Mitigation Methods for Overvoltage in Long-Cable-Fed PWM AC Drives," 2011 IEEE Energy Conversion Congress and Exposition, Phoenix, AZ, 2011, pp. 2160-2166.

K. K. Yuen and H. S. Chung, "A Low-Loss "RL-Plus-C" Filter for Overvoltage Suppression in Inverter-Fed Drive System With Long Motor Cable," in IEEE Transactions on Power Electronics, vol. 30, No. 4, pp. 2167-2181, Apr. 2015.

K. K. Yuen and H. S. Chung, "Use of Synchronous Modulation to Recover Energy Gained From Matching Long Cable n Inverter-Fed Motor Drives," in IEEE Transactions on Power Electronics, vol. 29, No. 2, pp. 883-893, Feb. 2014.

K. K. Yuen, H. S. Chung and V. S. Cheung, "An Active Low-Loss Motor Terminal Filter for Overvoltage Suppression and Common-Mode Current Reduction," in IEEE Transactions on Power Electronics, vol. 27, No. 7, pp. 3158-3172, Jul. 2012.

N. Aoki, K. Satoh and A. Nabae, "Damping Circuit to Suppress Motor Terminal Overvoltage and Ringing in PWM Inverter-fed AC Motor Drive Systems with Long Motor Leads," in IEEE Transactions on Industry Applications, vol. 35, No. 5, pp. 767-772, Sep.-Oct. 1999.

P. Mart-ro, W. Sae-Kok and S. Khomfoi, "Analysis of dv/dt Filter Installation for PWM AC Drive Applications," 2011 IEEE Ninth International Conference on Power Electronics and Drive Systems, Singapore, Dec. 5-8, 2011, pp. 177-184.

T. Shimizu, M. Saito, M. Nakamura and T. Miyazaki, "A Motor Surge Voltage Suppression Method With Surge Energy Regeneration," in IEEE Transactions on Power Electronics, vol. 27, No. 7, pp. 3434-3443, Jul. 2012.

Z. Liu and G. L. Skibinski, "Method to Reduce Overvoltage on AC Motor Insulation from Inverters with Ultra-Long Cable," 2017 IEEE International Electric Machines and Drives Conference (IEMDC), Miami, FL, 2017, pp. 1-8.

CN106787088A Abstract.
CN201418064Y Abstract.
JP2001298963 Abstract.
JP2014132811 Abstract.
UA30148U Abstract.

* cited by examiner

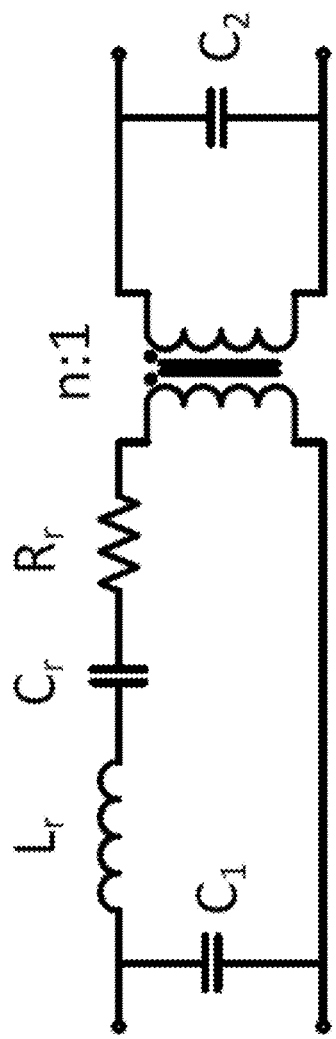
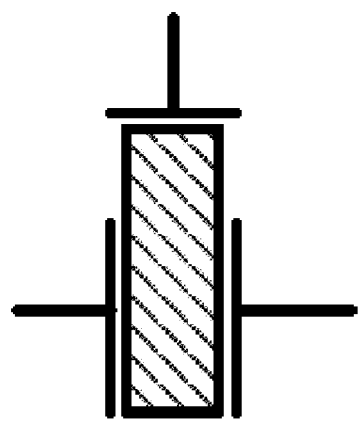
*Fig. 2B*
*Fig. 2A*

DAMPER FOR POWER TRAIN

FOREIGN PRIORITY

This application claims priority to European Application No. 19201530.3 filed Oct. 4, 2019, the entire contents of which is incorporated herein by reference.

TECHNICAL FIELD

The present disclosure relates to a damper to mitigate transmission line effects and dv/dt at the load end of a power train such as in an AC motor drive system.

BACKGROUND

Power trains typically include a power source connected to a load such as a motor via a power convertor/inverter. For example a three phase AC motor is conventionally driven from a power supply. If the power supply is AC power, a rectifier will convert the AC power to DC power on a DC link. An inverter provides the required three-phase AC power, e.g. at a different frequency from the power supply, to drive the motor, from the DC power. The drive power for the motor is often transmitted to the motor over long cables or lines.

The power cables have an inherent inductance and capacitance, and a mismatch between the cable impedance and the connected motor and other components can cause electrical reflections along the power cable. The inverter motor generates a PWM voltage pattern at the output. Sharp edges of the PWM signal interacting with the cable can cause a rapid increase in voltage creating a voltage surge at the motor terminals. These surges or spikes of current and voltage can cause so-called transmission line effects at the motor terminals. Such surges can have amplitudes of double the DC link voltage. Such phenomena are described extensively in the literature, e.g. E. Persson, "Transient effects in application of PWM inverters to induction motors," in IEEE Transactions on Industry Applications, vol. 28, no. 5, pp. 1095-1101, September-October 1992. J. C. G. Wheeler, "Effects of converter pulses on the electrical insulation in low and medium voltage motors," in IEEE Electrical Insulation Magazine, vol. 21, no. 2, pp. 22-29, March-April 2005. A. von Jouanne and P. N. Enjeti, "Design considerations for an inverter output filter to mitigate the effects of long motor leads in ASD applications," in IEEE Transactions on Industry Applications, vol. 33, no. 5, pp. 1138-1145, September-October 1997. Prasad Enjeti, Dudi Rendusara, and Annette von Jouanne, "Method and System for an Improved Converter Output Filter for an Induction Drive System", U.S. Pat. No. 6,122,184; Sep. 19, 2000. D. A. Rendusara and P. N. Enjeti, "An improved inverter output filter configuration reduces common and differential modes dv/dt at the motor terminals in PWM drive systems," in IEEE Transactions on Power Electronics, vol. 13, no. 6, pp. 1135-1143, November 1998. P. Mart-ro, W. Sae-Kok and S. Khomfoi, "Analysis of dv/dt filter installation for PWM AC drive applications," 2011 IEEE Ninth International Conference on Power Electronics and Drive Systems, Singapore, 2011, pp. 177-184. K. K. Yuen and H. S. Chung, "A Low-Loss "RL-Plus-C" Filter for Overvoltage Suppression in Inverter-Fed Drive System With Long Motor Cable," in IEEE Transactions on Power Electronics, vol. 30, no. 4, pp. 2167-2181, April 2015. N. Aoki, K. Satoh and A. Nabae, "Damping circuit to suppress motor terminal overvoltage and ringing in PWM inverter-fed AC motor drive systems with long motor leads," in IEEE Transactions on Industry Applications, vol. 35, no. 5, pp. 1014-1020, September-October 1999. A. F. Moreira, P. M. Santos, T. A. Lipo and G. Venkataramanan, "Filter networks for long cable drives and their influence on motor voltage distribution and common-mode currents," in IEEE Transactions on Industrial Electronics, vol. 52, no. 2, pp. 515-522, April 2005. J. He, G. Y. Sizov, P. Zhang and N. A. O. Demerdash, "A review of mitigation methods for overvoltage in long-cable-fed PWM AC drives," 2011 IEEE Energy Conversion Congress and Exposition, Phoenix, Ariz., 2011, pp. 2160-2166. K. K. Yuen, H. S. Chung and V. S. Cheung, "An Active Low-Loss Motor Terminal Filter for Overvoltage Suppression and Common-Mode Current Reduction," in IEEE Transactions on Power Electronics, vol. 27, no. 7, pp. 3158-3172, July 2012. T. Shimizu, M. Saito, M. Nakamura and T. Miyazaki, "A Motor Surge Voltage Suppression Method With Surge Energy Regeneration," in IEEE Transactions on Power Electronics, vol. 27, no. 7, pp. 3434-3443, July 2012. K. K. Yuen and H. S. Chung, "Use of Synchronous Modulation to Recover Energy Gained From Matching Long Cable in Inverter-Fed Motor Drives," in IEEE Transactions on Power Electronics, vol. 29, no. 2, pp. 883-893, February 2014. Z. Liu and G. L. Skibinski, "Method to reduce overvoltage on AC motor insulation from inverters with ultra-long cable," 2017 IEEE International Electric Machines and Drives Conference (IEMDC), Miami, Fla., 2017, pp. 1-8. These effects can cause damage to the motor windings and/or conductor insulation which can result in failure of the motor.

Today, wide band-gap rapid switching components made of SiC and GaN are often used for their improved switching properties, but these can create transmission line effects even in shorter cables. This means that the faster switching advantage of such devices is not fully exploited.

Various solutions to transmission line effects have been proposed, such as providing an oversized motor (less desirable where weight and size constraints apply such as in aircraft), or providing a passive filter (RC or RLC) at the inverter output or at the motor terminals. Such solutions, however, can result in excessive loss and the need to provide a bigger heat sink which increases the weight of the converter and reduces it attractiveness.

In one approach, transmission line effects are managed by an output RLC filter which 'slows down' the edges of the PWM signal to the motor. Such an arrangement can, however, lead to losses due to power dissipation. This is particularly problematic in e.g. aerospace applications because of excessive heatsink size. The use of capacitors can also give rise to reliability concerns.

An alternative approach to handling transmission line effects is the use of an RL output filter. Such a filter dissipates less power and does not have the problems associated with capacitors.

Output filters often dissipate large amounts of energy at their resistors, which negates the benefits of the new fast-switching devices.

Other solutions involve providing active circuits that match the cable impedance while being able to generate energy. RC components are selected to provide a certain terminating resistance to avoid high frequency components, achieved by matching the resistance to the characteristic impedance of the cable. Alternatively, RC components are selected to slow the voltage rise (dv/dt) at the motor terminal to acceptable levels for twice the time delay of the transmission line. RC terminators tend to dissipate less energy than RLC circuits and so can be preferable. The use of capacitors, again, however, can give rise to reliability issues.

Another problem with known power drives is that fast dv/dt transitions can inject a large common mode (CM) current into the chassis of the system such that the system is no longer compliant with e.g. EMI requirements. Large CM current can also contribute to ageing of the motor assembly.

Most of the solutions proposed for managing transmission line effects, discussed above, will not have significant impact on the CM current.

It would be desirable to provide a damper for a power train that effectively and efficiently manages transmission line effects without the use of a capacitor. It would also be desirable if such a damper could recycle the energy required to damp the voltage overshoot. Such a device could then be efficiently used with GaN or SiC-based devices, in which their beneficial properties can be fully exploited.

SUMMARY

According to the disclosure, there is provided a damper for a power train comprising a piezoelectric transformer and a load element connected across the output of the piezoelectric transformer.

Preferably, the damper comprises a piezoelectric transformer for each of one or more phase lines of the power train, each piezoelectric transformer having a respective load element connected across its output.

In one embodiment, for a three-phase power train, the damper has three piezoelectric transformers, one associated with each phase line, and three load elements, one for each transformer.

For a two-phase power train, the damper will have two piezoelectric transformers; for a single-phase power train, the damper has one piezoelectric transformer, and so on.

BRIEF DESCRIPTION OF THE DRAWINGS

FIG. 2a shows a piezoelectric transformer for use in a damper according to this disclosure.

FIG. 2b is an equivalent circuit of the piezoelectric transformer of FIG. 2a.

DETAILED DESCRIPTION

The described embodiments are by way of example only. The scope of this disclosure is limited only by the claims.

Figure 1:
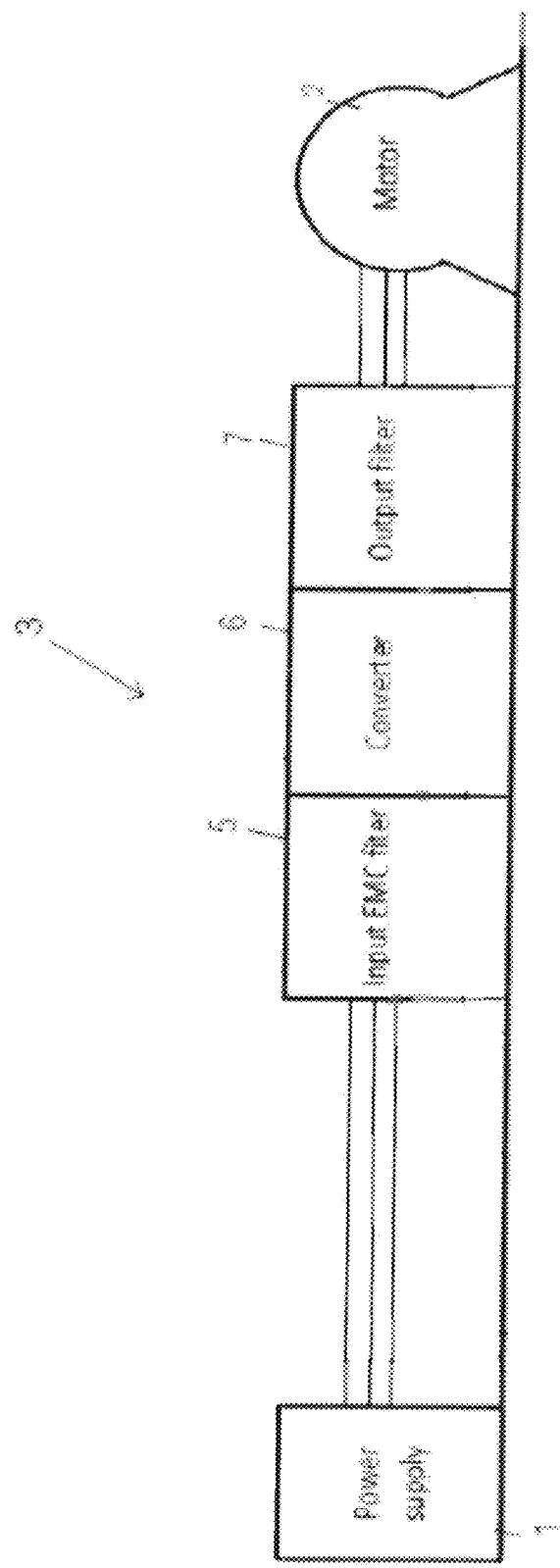
FIG. 1 is a schematic diagram of the components of a typical power train for a motor.

A typical power train for a motor is described with reference to FIG. 1. Power is provided from a power supply 1 to a motor 2 along a power train 3. The power from the power supply 1 passes through a converter which comprises, here, an input EMC filter 5 to reduce high frequency electronic noise that may cause interference with other devices, and a main converter 6. An output filter 7 is then generally provided to mitigate transmissions line effects as described above. The converter and input and output filters are mounted to a system chassis, e.g. a copper plate.

As described above, various solution have been proposed to address transmission line effects including those in CM mode. The damper of the present disclosure aims to address transmission line effects without the use of capacitors.

The present disclosure makes use of a piezoelectric transformer (PZT) to recreate the effect of an RC damper but without the use of a capacitor.

Piezoelectric materials have found an increasing number of applications in recent times due to their characteristics that enable electrical energy to be generated due to compressing or lengthening the piezoelectric component.

PZTs are solid state devices made up of two piezoelectric materials. One generates voltage when compressed, the other lengthens when a voltage is applied. By appropriate selection of the piezoelectric materials, such PZTs can be used as step up or step down transformers.

FIGS. 2a and 2b show a typical PZT (FIG. 2a) and the circuit equivalent of a PZT (FIG. 2b). From the equivalent circuit it can be seen that if the input (C1) and output (C2) capacitances are removed, or set to zero, the PZT has the equivalent structure of an RLC circuit. This can be used to function as an RC damper. In addition, a load needs to be added to the output of the PZT to either passively control the overshoot (e.g. a resistive element) or to actively recycle energy (if the load is a converter) and to control the overshoot.

Figure 3:
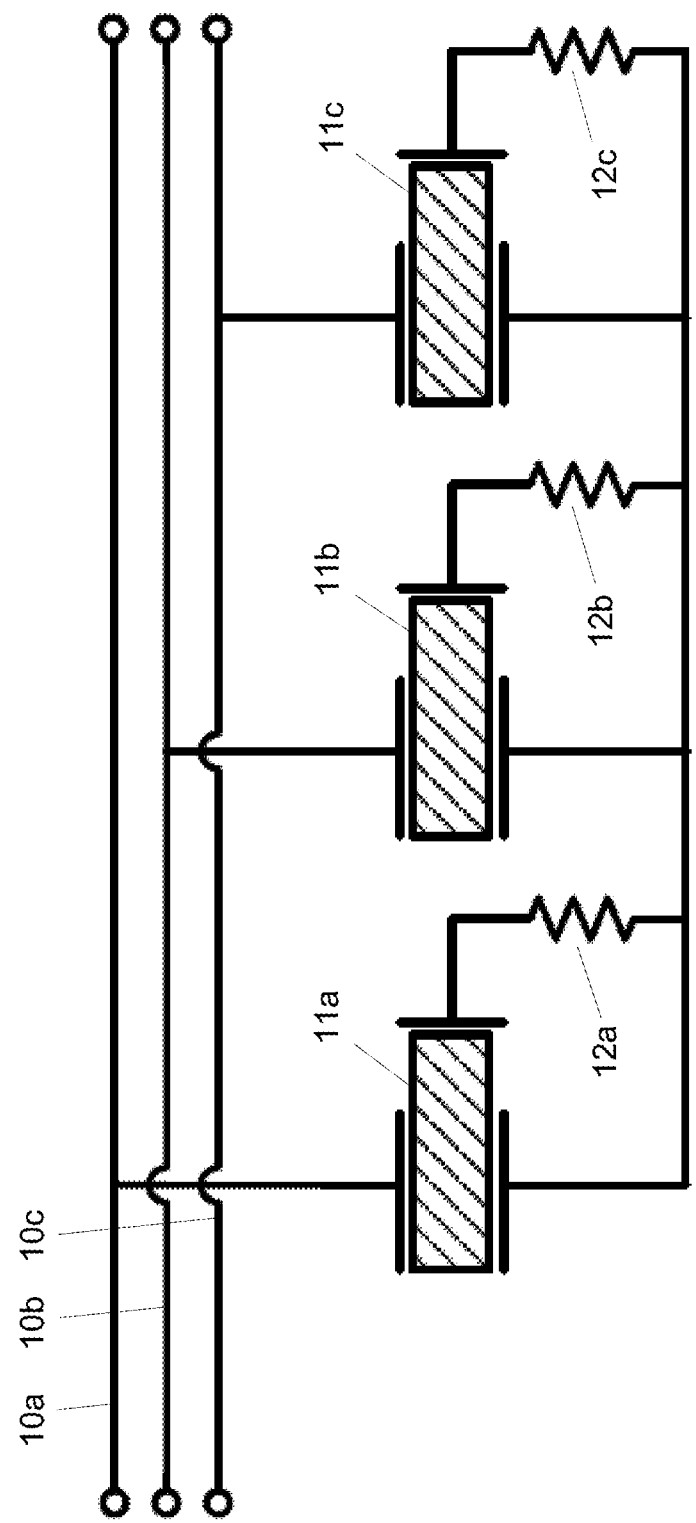
FIG. 3 is a schematic circuit diagram of a damper according to this disclosure.

FIG. 3 is a circuit diagram showing how such a loaded PZT can be connected to the motor terminal for a three phase system. For each phase line 10a, 10b, 10c there is provided a respective PZT 11a, 11b, 11c each loaded with a respective resistive element or converter 12a, 12b, 12c. The same principle can be applied to a single or other multi-phase system. For the sake of simplicity, the structure for a single phase system will be used for the following description.

Figure 4:
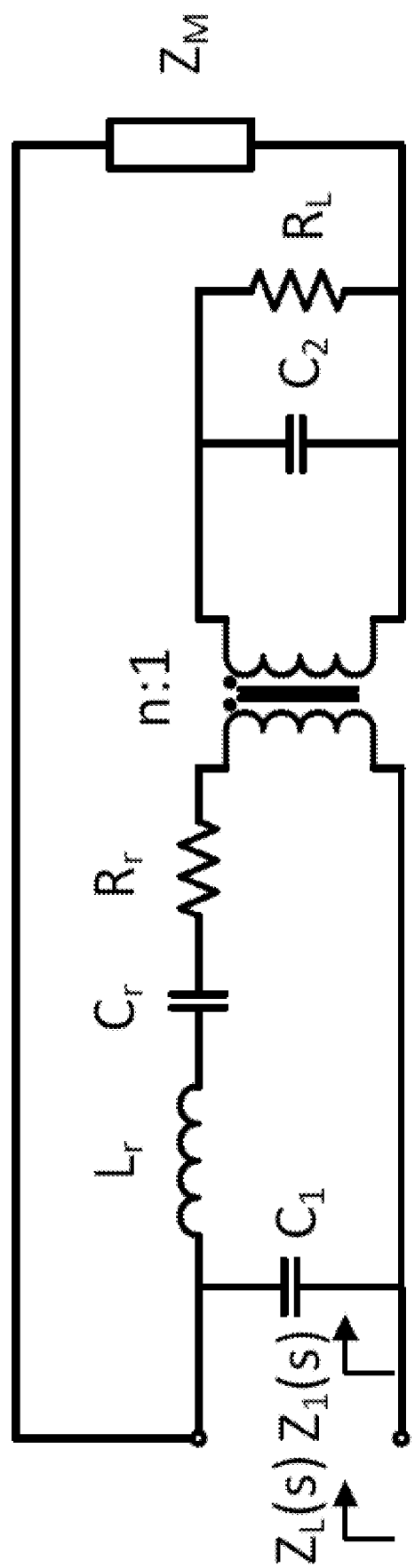
FIG. 4 is a single phase equivalent circuit of a damper according to this disclosure.

FIG. 4 shows the equivalent circuit for a single phase system. The PZT is represented as shown in FIG. 2b to which a resistive load RL is added. ZM is the motor impedance.

The transfer function for a conventional RC damper is represented as:

$$Z_1(s) = \frac{sR_M C_M + 1}{sC_M}$$

The inventors performed testing to determine if the same damping effect can be obtained using a PZT damper, i.e. by obtaining a similar transfer function.

Setting C2 to zero (which is acceptable because C2 only causes effects in a high frequency range that is not of interest in this context), and considering $R_L$ and $R_r$ as a single entity, the transfer function of the proposed damper can be represented as $$Z_1(s) = \frac{s^2 L_r C_r + s C_r R_L + 1}{s(C_r + C_1)(s^2 L_r C_{eq} + s C_{eq} R_L + 1)}$$

Where $C_{eq}$ can be defined as $$C_{eq} = \frac{C_1 C_r}{C_r + C_1}$$

Figure 5B:
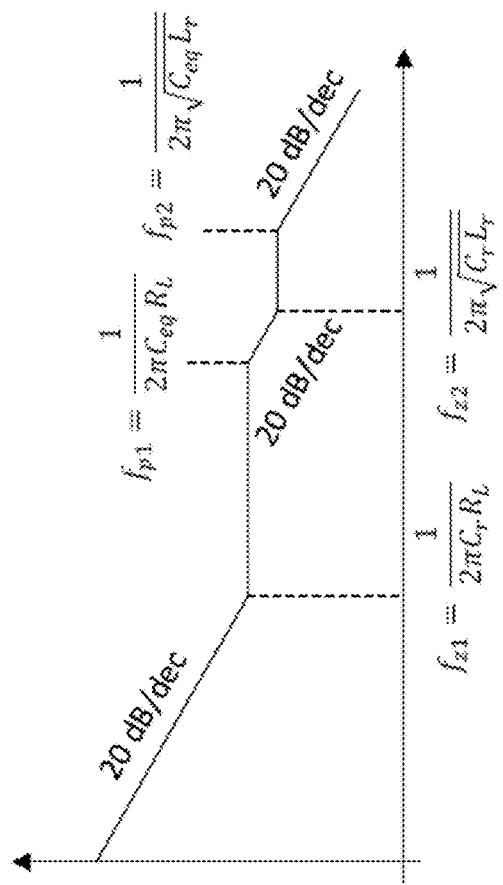
FIG. 5b shows an ideal transfer function of a damper according to this disclosure.
Figure 5A:
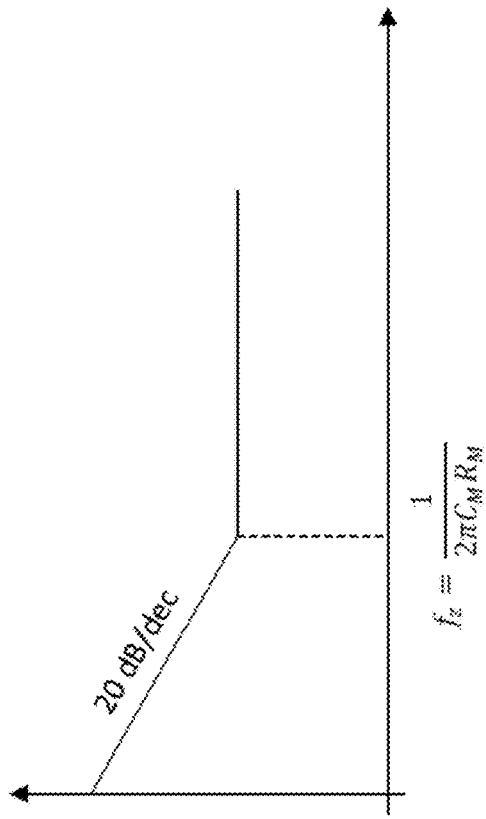
FIG. 5a shows an ideal transfer function for a conventional RC damper.

FIGS. 5a and 5b compare the ideal transfer function for a conventional RC damper (FIG. 5a) with that for the proposed PZT damper (FIG. 5b).

As can be seen, the performances in the lower frequency ranges are essentially identical. There is a difference at higher frequencies but such high frequencies are not relevant here.

Further, tests have shown that the optimum point in terms of overshoots depends on the selected value for the resistive load RL connected to the output of the PZT. The higher the overshoot reduction required the higher the losses are going to be on the resistor or converter.

If, instead of a resistor load, the PZT is loaded with a converter, this value RL can be controlled to enable recycling of energy and also to adapt the power within a certain range.

The load can also be adjusted to work for cables of different lengths.

FIGS. 6 to 10 show some alternative ways, as examples only, of how the concept of this disclosure can be implemented in a power train.

All of FIGS. 6 to 10 show, schematically, a damper 20 according to the disclosure connected at the terminals of a load—i.e. here a motor 21. The motor 21 is connected to a power source 22 (here a PWM-based power source) via cables 23 which can be very long. The damper 20 is located at the motor terminals.

Figure 6:
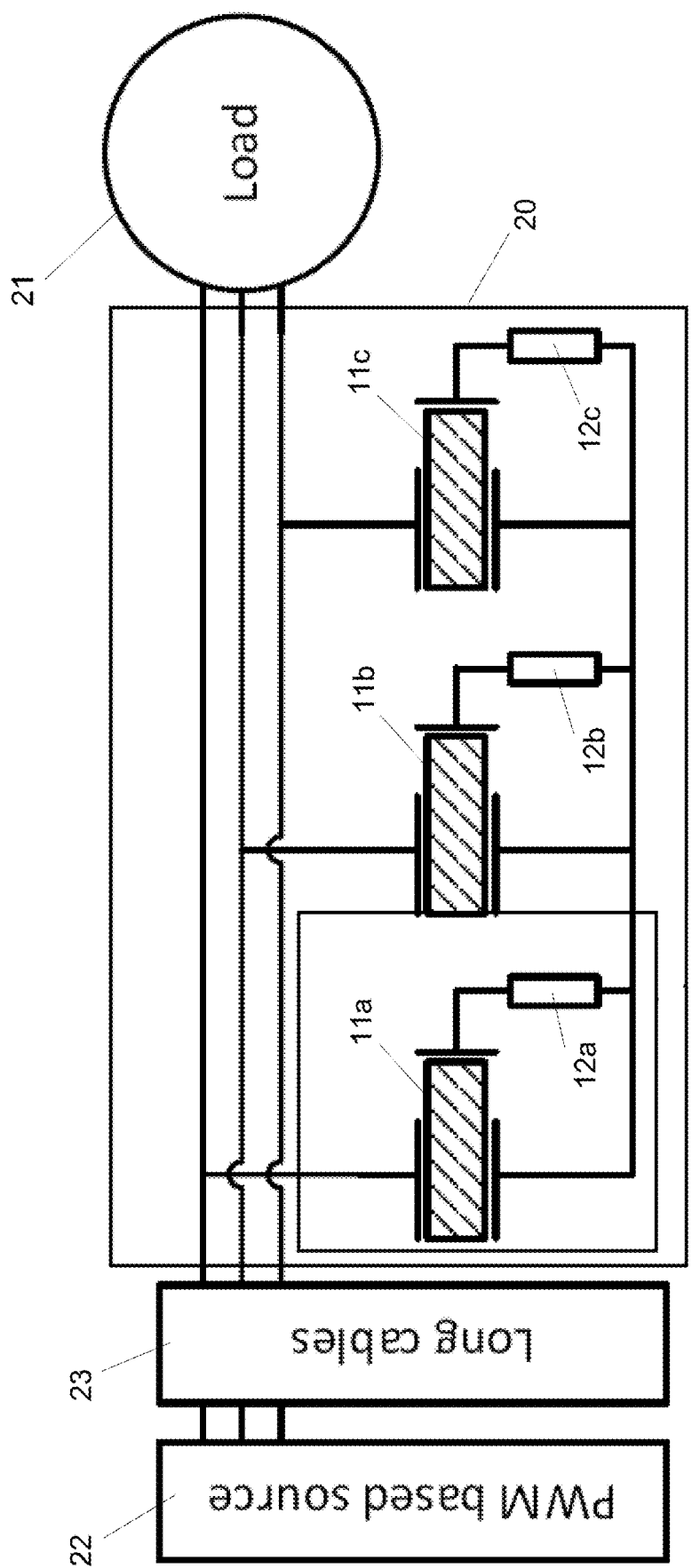
FIG. 6 is a power train incorporating a damper according to a three-phase embodiment of this disclosure.

FIG. 6 shows a three phase system in which the structure of the damper 20 is the same as shown and described in relation to FIG. 3. The same reference numerals are used for corresponding components in FIG. 6.

Figure 7:
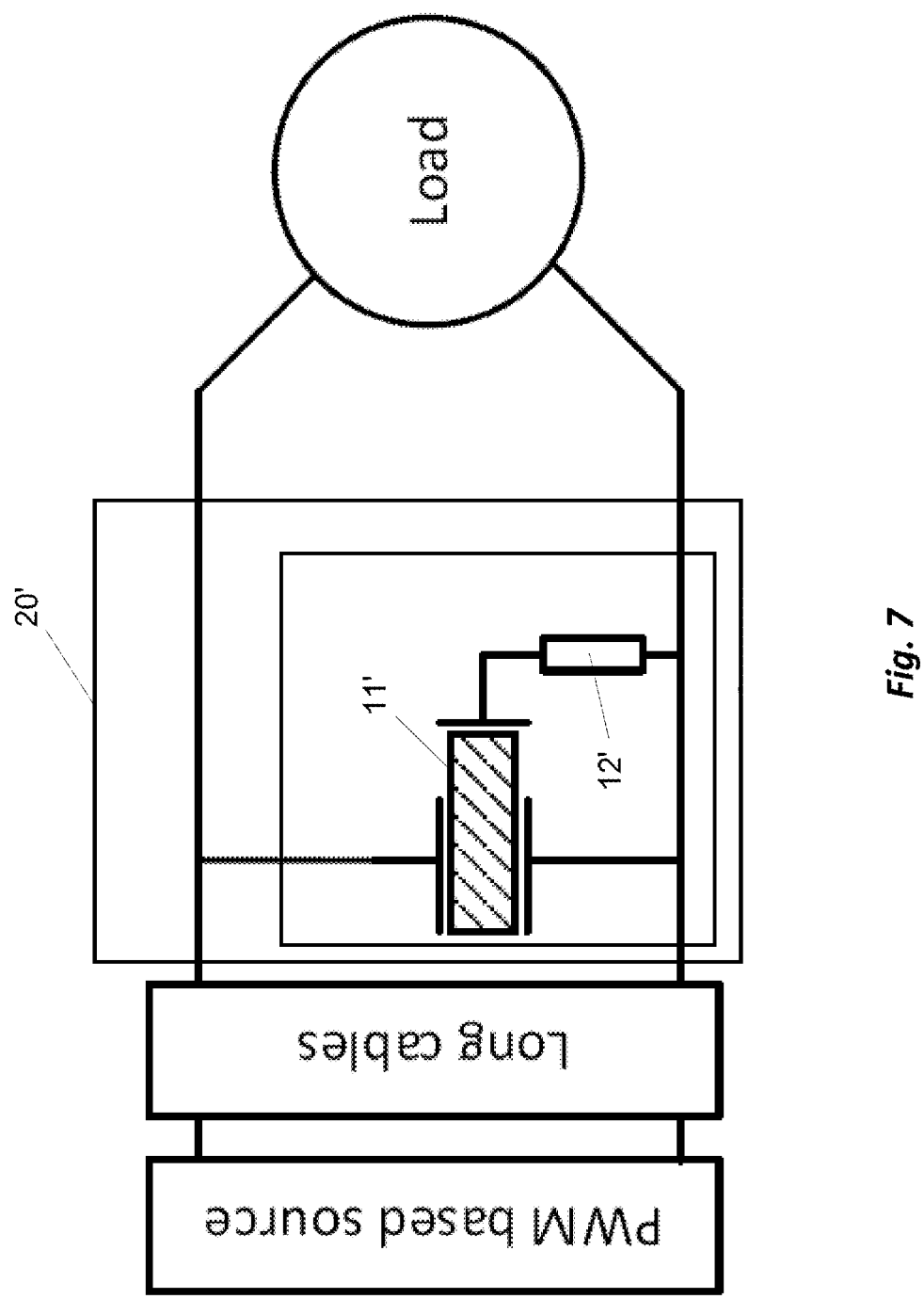
FIG. 7 is a power train incorporating a damper according to a single phase embodiment of this disclosure.

FIG. 7 shows a single phase system, where the damper 20' comprises a single PZT 11' loaded with a resistive element 12' or a converter.

Figure 8:
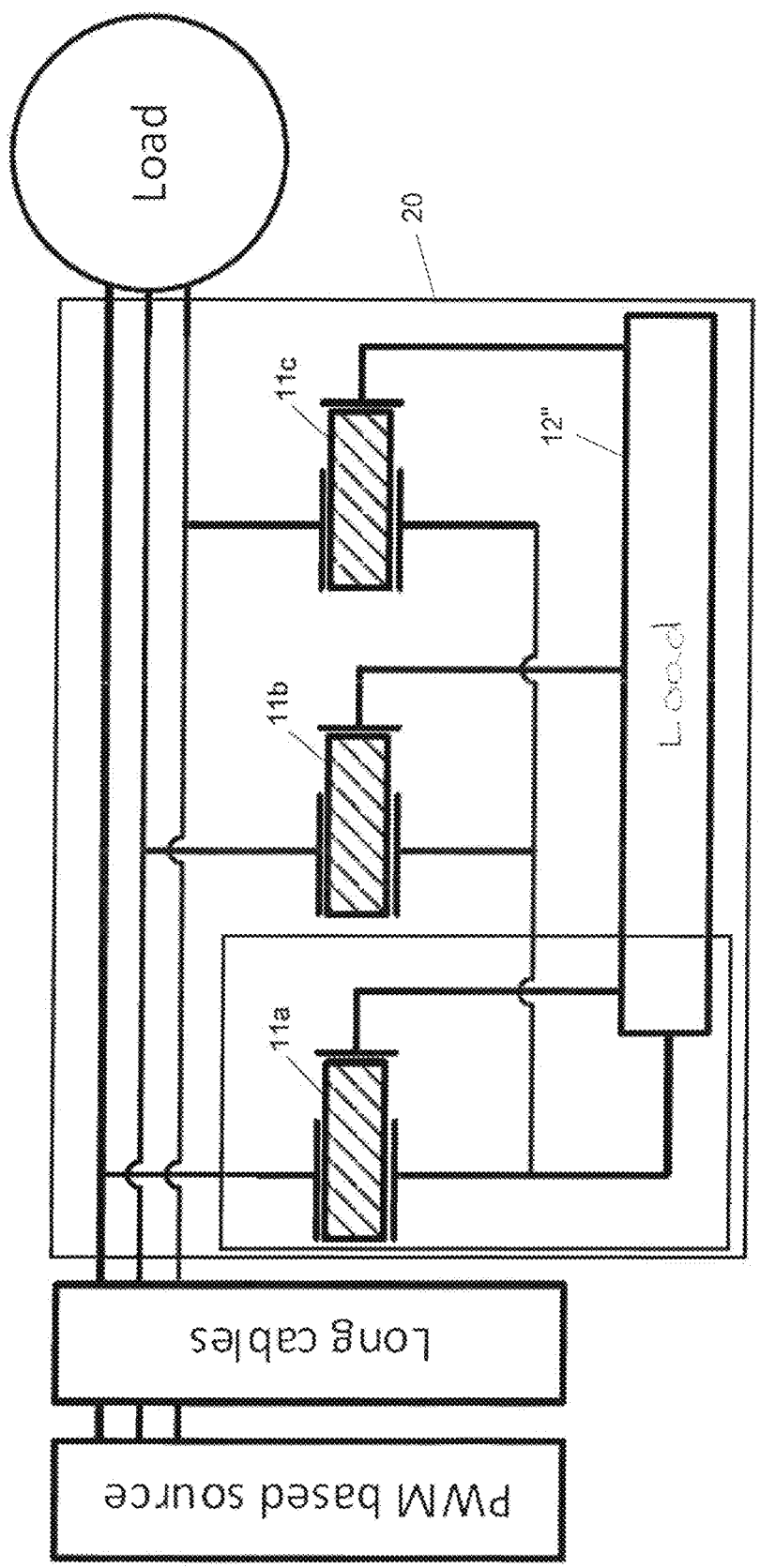
FIG. 8 is a power train incorporating a damper according to another three-phase embodiment of this disclosure with a common load.

FIG. 8 shows a three phase system similar to that of FIG. 6 but all three PZTs 11a, 11b, 11b share the same load 12''.

Figure 9:
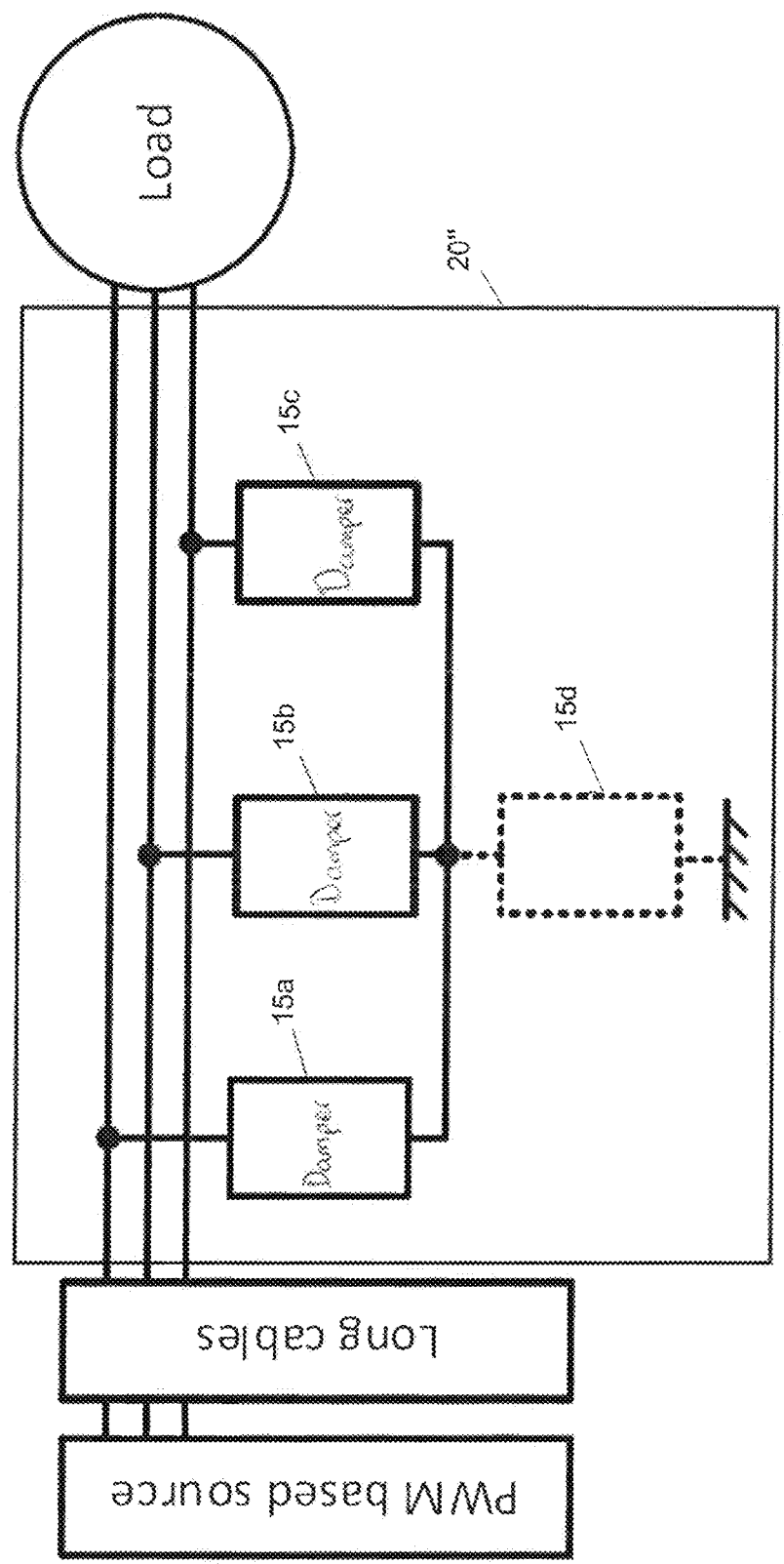
FIG. 9 is a power train incorporating a damper according to another embodiment of this disclosure.

FIG. 9 shows an alternative three phase system where the damper structures for each phase (here a block 15a, 15b, 15c, 15d) representing a loaded PZT as previously described, are arranged in a star configuration 20'' where the star point may be connected to the system chassis directly or via an additional damper 5d. In such an arrangement, some of the loads may be passive and some active.

Figure 10:
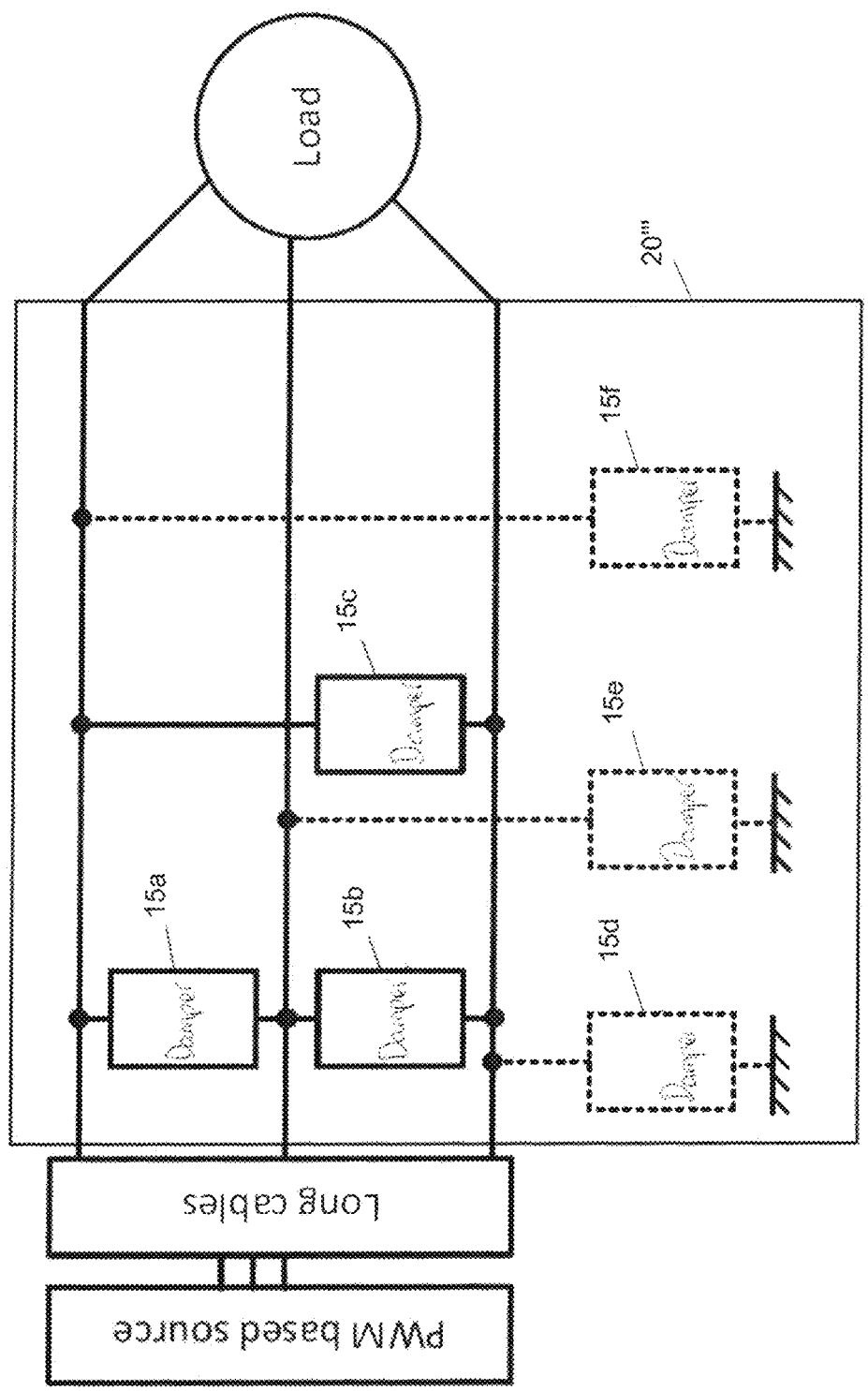
FIG. 10 is a power train incorporating a damper according to another embodiment of this disclosure.

FIG. 10 shows the damper structures arranged in a 'wye' configuration 20''' referenced to the system chassis either directly or via additional dampers 15e, 15f, 15g.

The damper can be used in a power train with a PWM based source to manage transmission line effects. The damper can also reduce dv/dt at the motor terminals, reduced common mode currents and reduce stress on the motor windings.

The description is of preferred embodiments only. The scope of protection is defined by the claims.

The invention claimed is:

1. A power train for a high impedance load, comprising:
    an input EMC filter for connection to a power supply;
    a pulse width modulation (PWM) converter connected to an output of the input EMC filter and configured to provide a PWM output to drive the high impedance load; and
    a damper connected between an output of the PWM converter and terminals of the high impedance load, wherein the damper comprises:
    a piezoelectric transformer; and
    a load element connected across an output of the piezoelectric transformer.

2. A power train according to claim 1 wherein the damper further includes:
    a piezoelectric transformer for each of one or more phase lines of the power train, each piezoelectric transformer having a respective load element connected across its output.

3. A power train according to claim 2, for a three-phase power train, wherein the damper has three piezoelectric transformers, one associated with each phase line, and three load elements, one for each transformer.

4. A power train according to claim 2, for a two-phase power train, wherein the damper has two piezoelectric transformers, one associated with each phase line, and two load elements, one for each transformer.

5. A power train according to claim 2, for a single-phase power train, having a single piezoelectric transformer, and a single load element.

6. A power train according to claim 1, for a three-phase power train, wherein the damper comprises three piezoelectric transformers, one associated with each phase line, and a single load common to all piezoelectric transformers.

7. A power train according to claim 1, wherein the load element is a resistor.

8. A power train according to claim 1, wherein the load element is a power converter configured to regenerate switching energy.

9. The power train of claim 1, further comprising the power supply.

10. The power train of claim 1, further comprising the high impedance load, wherein the high impedance load is connected to an output of the damper.

11. The power train of claim 10, wherein the high impedance load is a motor.

* * * * *